United States Patent
Kim

(10) Patent No.: US 7,217,627 B2
(45) Date of Patent: May 15, 2007

(54) SEMICONDUCTOR DEVICES HAVING DIFFUSION BARRIER REGIONS AND HALO IMPLANT REGIONS AND METHODS OF FABRICATING THE SAME

(75) Inventor: Hak-Dong Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/944,316

(22) Filed: Sep. 17, 2004

(65) Prior Publication Data

US 2005/0077573 A1   Apr. 14, 2005

(30) Foreign Application Priority Data

Sep. 18, 2003   (KR) .................... 10-2003-0064912

(51) Int. Cl.
*H01L 21/336* (2006.01)
*H01L 21/8234* (2006.01)
*H01L 21/425* (2006.01)

(52) U.S. Cl. .................. 438/305; 438/197; 438/289; 438/514

(58) Field of Classification Search ............... 438/197, 438/223, 289–291, 301–308, 514
See application file for complete search history.

(56) References Cited

U.S. PATENT DOCUMENTS

| 6,417,547 B2 | 7/2002 | Kang ..................... 257/369 |
| 6,518,136 B2 | 2/2003 | Lee et al. ................. 438/303 |
| 6,596,554 B2 | 7/2003 | Unnikrishnan ............ 438/18 C |
| 2004/0004250 A1* | 1/2004 | Momiyama et al. ........ 438/223 |

* cited by examiner

*Primary Examiner*—Cuong Nguyen
(74) *Attorney, Agent, or Firm*—Andrew D. Fortney

(57) ABSTRACT

The present disclosure provides an example of a semiconductor device. In addition, a method for fabricating a semiconductor device is outlined. The semiconductor device may be fabricated by providing a semiconductor substrate, forming a gate over the substrate, forming diffusion barrier ion regions, forming halo regions, forming a source, and forming a drain.

20 Claims, 3 Drawing Sheets

SEMICONDUCTOR DEVICES HAVING DIFFUSION BARRIER REGIONS AND HALO IMPLANT REGIONS AND METHODS OF FABRICATING THE SAME

TECHNICAL FIELD

The present disclosure relates to semiconductor devices and, in particular, to semiconductor devices and methods for fabricating the same.

BACKGROUND

As the minimum feature size in semiconductor integrated circuits shrinks, the distance between the source and drain regions becomes smaller. The reduced spacing between the source and drain regions for the field-effect transistors results in short channel effects.

To relieve the short channel effects, the semiconductor industry is constantly optimizing the fabrication processes for metal oxide semiconductor field effect transistor (MOSFET) devices. Current trends in very large scale integration (VLSI) fabrication of complimentary metal oxide semiconductor (CMOS) devices seem to focus on reducing the junction depth of the source/drain regions because shallow junctions reduce the encroachment of the source/drain depletion regions into the channel.

As CMOS technology becomes smaller, e.g., less than 50 nanometers (nm) in gate length, it becomes more and more difficult to improve the short channel device performance and at the same time maintain acceptable values for off-state leakage current.

One technique for trying to achieve this is a halo implant having extra dopant implant regions positioned next to the source and drain extension regions. The halo implant, also called a "pocket implant," can limit the lateral diffusion of the source and drain impurities. The halo implant implants impurities having a conductivity type opposite to that of the source and drain. Usually, the halo implant comes after defining the gate and before the source/drain diffusion. However, the halo impurities also diffuse into the source/drain or the channel region during an annealing for the source/drain diffusion. This diffusion of the halo impurities may cause a threshold voltage of the transistor to fall outside of a pre-determined range, and the leakage currents may also be increased.

DETAILED DESCRIPTION

Figure 1A:
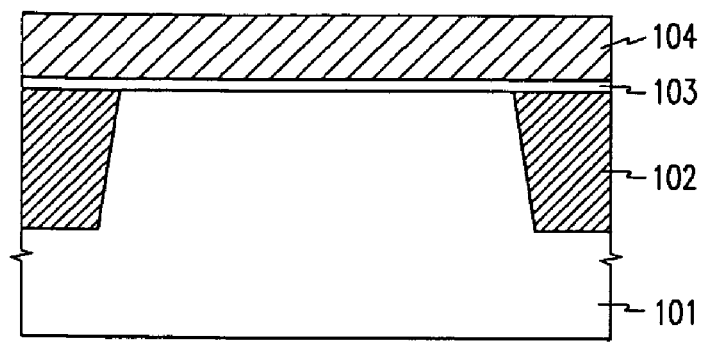
FIGS. 1A to 1E show cross sectional views illustrating various stages of fabrication of a semiconductor device according to the present disclosure.
Figure 1B:
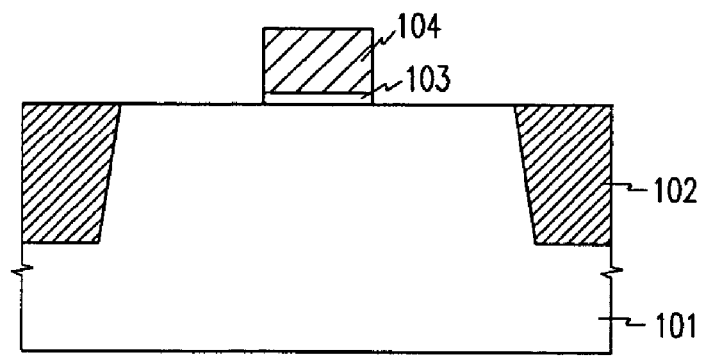
Figure 1C:
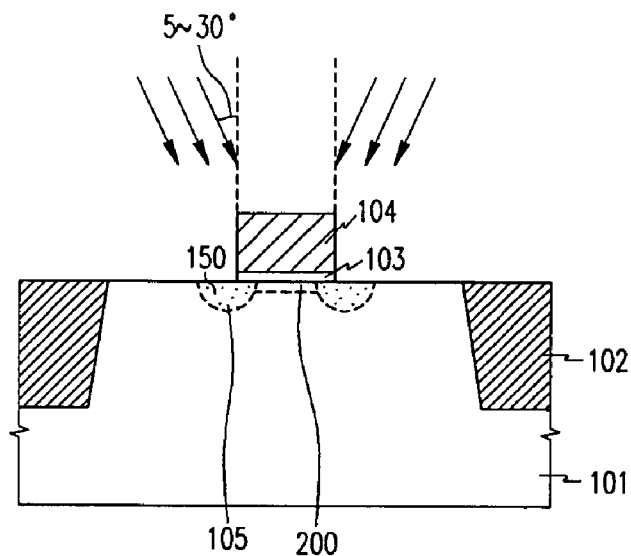
Figure 1D:
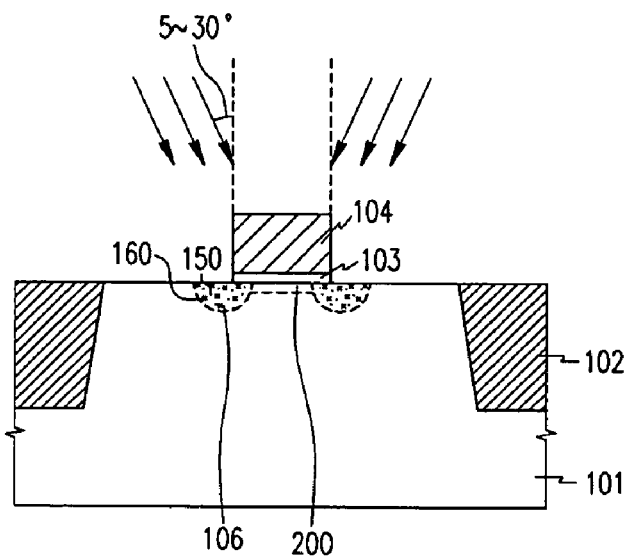
Figure 1E:
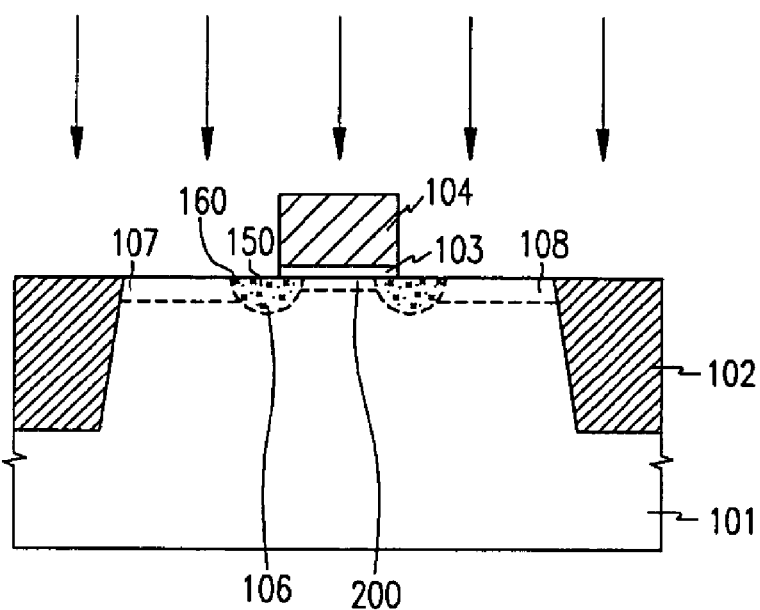

With reference to FIG. 1E, a gate 104 is formed over a semiconductor substrate 101. A gate insulating layer 103 is formed below the gate 104. The gate 104 defines a channel 200 thereunder in the substrate 101 having a source side and a drain side.

Two halo regions 106 are formed in the source side and the drain side of the channel 200, contacting the channel 200. Halo regions 106 contain halo impurity ions 160 of a first conductivity, which are injected by performing a tilted ion implantation.

In the halo regions 106, diffusion barrier ions 150 are also injected. The diffusion barrier ion 150 is smaller than an atom of the substrate 101 and has corresponding size to the halo impurity ion 160. Therefore, the diffusion barrier ion 150 occupies an interstitial site in a crystal lattice of the substrate 101 and acts as a diffusion barrier of the halo impurity ion 160.

The diffusion barrier ions 150 can be injected by performing a tilted ion implantation.

For example, the diffusion barrier ion 150 can be a carbon ion and the halo impurity ion 160 can be a boron ion.

A source 107 is formed in the substrate 101 adjacent to the source side of the channel 200. In the same way, a drain 108 is formed in the substrate 101 adjacent to the drain side of the channel 200.

One of the halo regions 106 is located between the source 107 and the channel 200, and the other halo region 106 is located between the drain 108 and the channel 200.

The source 107 and drain 108 contain impurity ions of a second conductivity different from the conductivity of the halo ions. For example, the first conductivity can be p-type and the second conductivity can be n-type.

The method for fabricating the semiconductor device as described above is explained in detail as follows.

First, an isolation process, for example, shallow trench isolation (STI), is performed to define an active area in a semiconductor substrate 101. As shown in FIG. 1A, a trench 102 is formed in a field area of the substrate 101 as a result of the STI process.

A single crystalline silicon wafer of a first conductivity, for example, p-type, can be used as the substrate 101.

A gate insulating layer 103 is formed on the active area of the substrate 101. The gate insulating layer 103 may be a silicon oxide formed by thermal oxidation.

After forming the gate insulating layer 103, $BF_2$ ions can be implanted into the surface of the substrate 101 for controlling a threshold voltage.

A conducting layer for a gate 104 is formed on the gate insulating layer 103. For example, a highly doped-polycrystalline silicon layer or a silicide layer thereon may be used as the conducting layer.

A photoresist pattern having a gate pattern is formed on the conducting layer. The photoresist pattern is used to etch the conducting layer and the gate insulating layer 103 to form gate 104 and the gate insulating layer 103 on portions of the active area.

Gate 104 may define an upper border of channel 200 in the substrate 101 during the operation of the device.

Before halo ion implantation, diffusion barrier ions 150 are injected into the substrate 101 to form diffusion barrier ion regions 105, which correspond to halo regions 106 and are in contact with the channel 200, as shown in FIG. 1C.

For example, carbon ions can be tilt implanted with a tilt angle of 5° to 30° from an axis orthogonal to the surface of the substrate 101. The carbon ions can be implanted with an energy of 10 to 50 kilo electron-volts (keV) and a concentration of $10^{13}$ to $10^{15}$ ions/cm$^2$.

Next, halo impurity ions 160 of a first conductivity are injected into the portions of the substrate 101 corresponding to the diffusion barrier ion regions 105 to form halo regions 106, as shown in FIG. 1D.

For example, boron ions or hydrogen ions can be tilt implanted with a tilt angle of 5° to 30° from an axis orthogonal to the surface of the substrate 101. The boron ions can be implanted with an energy of 10 to 50 keV and a concentration of $5\times10^{13}$ to $5\times10^{14}$ ions/cm$^2$.

The diffusion barrier ion 150 is smaller than an atom of the substrate 101 and has corresponding size to the halo impurity ion 160. Therefore, the implanted diffusion barrier ion 150 occupies an interstitial site in a crystal lattice of the substrate 101 and acts as a diffusion barrier of the halo impurity ions 160.

The interstitial site in a silicon crystal lattice has a smaller space than the size of the silicon atom. When a smaller atom than the silicon atom is injected in the silicon matrix, the small atom diffuses along the interstitial site.

Therefore, a diffusion barrier ion having a size similar to that of the halo impurity ion and occupying the interstitial site, blocks the diffusion of the halo impurity ion into the source/drain or the channel.

Next, as shown in FIG. 1E, a source 107, and a drain 108 are formed by injecting impurity ions of a second conductivity. The source 107 is formed in the substrate 101 adjacent to the source side of the channel 200, and the drain 108 is formed in the substrate 101 adjacent to the drain side of the channel 200.

Arsenic ions or phosphorus ions can be used as the impurity ions of a second conductivity. For example, arsenic ions can be implanted with an energy of 10 to 30 keV and a concentration of $1\times10^{14}$ to $1\times10^{15}$ ions/cm$^2$ and phosphorus ions can be implanted with an energy of 5 to 25 keV and a concentration of $1\times10^{14}$ to $1\times10^{15}$ ions/cm$^2$.

Finally, the substrate 101 is annealed at about 900° C. to 1050° C. for a time period of about 10 to about 20 seconds to activate the implanted ions. That is, during the annealing, the diffusion barrier ions and halo impurity ions are activated, and the formation of the source and drain is completed by activating the impurity ions of the second conductivity.

As described above, the diffusion of the halo impurity ions into the source, drain, and/or the channel is prevented due to the diffusion barrier ions which occupy the interstitial site in the crystal lattice of the substrate.

Therefore, the profile of the halo regions can be controlled in detail.

The subject matter disclosed in this application was disclosed in a corresponding Korean patent application. Accordingly, this application claims priority to and the benefit of Korean Patent Application No. 10-2003-0064912, filed on Sep. 18, 2003 in the Korean Intellectual Property Office. The entire contents of Korean Patent Application No. 10-2003-0064912 are incorporated herein by reference.

As disclosed herein in detail, a semiconductor device and a fabrication method thereof prevent the diffusion of the halo impurities.

In one example, a semiconductor device may include a semiconductor substrate and a gate formed over the substrate. The gate may define a channel in the substrate having a source side and a drain side. Halo regions may be formed in the source side and the drain side of the channel. The halo regions may contact the channel and contain halo impurity ions of a first conductivity. A source formed in the substrate may contain impurity ions of a second conductivity. A drain formed in the substrate may contain impurity ions of a second conductivity. Diffusion barrier ions may be injected in the halo regions in some configurations.

According to one example, the diffusion barrier ion may occupy an interstitial site in a crystal lattice of the substrate. The diffusion barrier ion may be smaller than an atom of the substrate and have corresponding size to the halo impurity ion. In one example, the diffusion barrier ion may be a carbon ion and the halo impurity ion may be a boron ion.

The first conductivity may be p-type and the second conductivity may be n-type.

Also disclosed herein is a method of fabricating a semiconductor device by providing a semiconductor substrate and forming a gate over the substrate. The gate defines a channel in the substrate having a source side and a drain side. Diffusion barrier ion regions may be formed by injecting diffusion barrier ions into the source side and the drain side of the channel. The diffusion barrier ion regions may be in contact with the channel. Halo regions may be formed by injecting halo impurity ions of a first conductivity into the portions corresponding to the diffusion barrier ion regions. A source may be formed by injecting impurity ions of a second conductivity into the substrate adjacent to the source side of the channel. A drain may be formed by injecting impurity ions of a second conductivity into the substrate adjacent to the drain side of the channel.

The diffusion barrier ion regions may be formed by performing a tilted ion implantation with a tilt angle of 5° to 30° from an axis orthogonal to the surface of the substrate.

The halo impurity ion regions may be formed by performing a tilted ion implantation with a tilt angle of 5° to 30° from an axis orthogonal to the surface of the substrate.

The diffusion barrier ions may be injected with an energy of 10 to 50 keV and a concentration of $10^{13}$ to $10^{15}$ ions/cm$^2$.

The halo impurity ions may be injected with an energy of 10 to 50 keV and a concentration of $5\times10^{13}$ to $5\times10^{14}$ ions/cm$^2$.

As the impurity ions of the second conductivity, arsenic ions may be injected with an energy of 10 to 30 keV and a concentration of $1\times10^{14}$ to $1\times10^{15}$ ions/cm$^2$ to form the source and drain.

As the impurity ions of the second conductivity, phosphorus ions may be injected with an energy of 5 to 25 keV and a concentration of $1\times10^{14}$ to $1\times10^{15}$ ions/cm$^2$ to form the source and drain.

Additionally, the method further includes annealing the substrate at a temperature of about 900° C. to 1050° C. for a time period of about 10 to about 20 seconds.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a semiconductor device comprising:
   providing a semiconductor substrate;
   forming a gate over the substrate such that a channel is formed in the substrate having a source side and a drain side, wherein at least a portion of the channel is defined by the gate;
   forming diffusion barrier ion regions by injecting diffusion barrier ions into the source side and the drain side of the channel, wherein the diffusion barrier ion regions are in contact with the channel;
   forming halo regions by injecting halo impurity ions of a first conductivity into the portions corresponding to the diffusion barrier ion regions after forming diffusion barrier ion regions;
   forming a source by injecting impurity ions of a second conductivity into the substrate adjacent to the source side of the channel; and
   forming a drain by injecting impurity ions of the second conductivity into the substrate adjacent to the drain side of the channel.

2. A method as defined by claim 1, wherein at least one of the diffusion barrier ions occupies an interstitial site in a crystal lattice of the substrate.

3. A method as defined by claim 1, wherein at least one of the diffusion barrier ions is smaller than an atom of the substrate and has size corresponding to the halo impurity ion.

4. A method as defined by claim 1, wherein at least one of the diffusion barrier ions comprises carbon.

5. A method as defined by claim 1, wherein at least one of the halo impurity ions comprises baron.

6. A method as defined by claim 1, wherein forming the diffusion barrier ion regions comprises performing a tilted ion implantation with a tilt angle of 5° to 30° from an axis orthogonal to the surface of the substrate.

7. A method as defined by claim 1, wherein forming the halo impurity ion regions comprises performing a tilted ion implantation with a tilt angle of 5° to 30° from an axis orthogonal to the surface of the substrate.

8. A method as defined by claim 1, wherein the diffusion barrier ions are injected with an energy of 10to 50 keV and a concentration of $10^{13}$ to $10^{15}$ ions/cm$^2$.

9. A method as defined by claim 1, wherein the halo impurity ions are injected with an energy of 10 to 50 keV and a concentration of $5\times10^{13}$ to $5\times10^{14}$ ions/cm$^2$.

10. A method as defined by claim 1, wherein as the impurity ions of the second conductivity comprise arsenic, injected with an energy of 10 to 30 keV and a concentration of $1\times10^{14}$ to $1\times10^{15}$ ions/cm$^2$ to form the source and drain.

11. A method as defined by claim 1, wherein as the impurity ions of the second conductivity comprise phosphorus, injected with an energy of 5 to 25 keV and a concentration of $1\times10$–to $1\times10^{15}$ ions/cm$^2$ to from the source and drain.

12. A method as defined by claim 1 further comprising:
    annealing the substrate at a temperature of about 900° C. to 1050° C. for a time period of about 10 to about 20 seconds.

13. A method as defined by claim 1, wherein the first conductivity is p-type and the second conductivity is n-type.

14. The method as defined by claim 1, wherein the halo impurity ions are injected into only the portions of the substrate corresponding to the diffusion barrier ion regions.

15. A method for fabricating a semiconductor device comprising:
    forming a gate over a semiconductor substrate to form a channel in the substrate having a source side and a drain side;
    injecting diffusion barrier ions into the source side and the drain side of the channel, in contact with the channel to form diffusion barrier ion regions;
    after forming diffusion barrier ion regions, injecting halo impurity ions of a first conductivity only into regions containing the diffusion barrier ions;
    forming a source and drain by injecting impurity ions of a second conductivity into the substrate adjacent to the source and drain sides of the channel.

16. The method as defined by claim 15, wherein the diffusion barrier ion is smaller than an atom of the substrate and has a size corresponding to the halo impurity ion.

17. The method as defined by claim 16, wherein the substrate comprises silicon, the diffusion barrier ions comprise carbon, and the halo impurity ions comprise boron.

18. The method as defined by claim 16, wherein each of the diffusion barrier ion region and halo impurity ion region forming steps comprises injecting the ions with an energy of 10 to 50 keV.

19. The method as defined by claim 15, wherein each of the diffusion barrier ion region and halo impurity ion region forming steps comprises performing a tilted ion implantation with a tilt angle 5° to 30° from an axis orthogonal to the surface of the substrate.

20. The method as defined by claim 15, wherein the impurity ions comprise arsenic or phosphorus, with a concentration of $1\times10^{14}$ to $1\times10^{15}$ ions/cm$^2$.

* * * * *